United States Patent [19]

Hartmann et al.

[11] Patent Number: 5,515,605
[45] Date of Patent: May 14, 1996

[54] APPARATUS AND PROCESS FOR SOLDERING COMPONENT ONTO BOARDS

[75] Inventors: Horst-Joachim Hartmann; Peter Saile, both of Stuttgart, Germany

[73] Assignee: Robert Bosch GmbH, Stuttgart, Germany

[21] Appl. No.: 290,705

[22] PCT Filed: Jun. 25, 1993

[86] PCT No.: PCT/DE93/00557

§ 371 Date: Jan. 19, 1995

§ 102(e) Date: Jan. 19, 1995

[87] PCT Pub. No.: WO94/02279

PCT Pub. Date: Feb. 3, 1994

[30] Foreign Application Priority Data

Jul. 22, 1992 [DE] Germany ................. 42 24 095.6
Feb. 3, 1993 [DE] Germany ................. 43 02 976.0

[51] Int. Cl.⁶ ............................................. H05K 3/34
[52] U.S. Cl. ................ 29/840; 219/85.12; 228/180.21; 392/419
[58] Field of Search ................. 219/229, 230, 219/553, 85.12; 392/407, 419; 228/180.21; 29/840

[56] References Cited

U.S. PATENT DOCUMENTS

| | | | |
|---|---|---|---|
| 3,283,124 | 11/1966 | Kawecki | 219/85.12 X |
| 3,632,955 | 1/1972 | Cruickshank et al. | 228/180.21 X |
| 4,278,867 | 7/1981 | Tan | 219/85.12 X |
| 4,332,342 | 6/1982 | van Der Put | 228/180.21 |
| 4,363,434 | 12/1982 | Flury | 228/56.5 X |
| 4,379,218 | 4/1983 | Grebe et al. | 228/180.21 X |
| 4,650,950 | 3/1987 | Hayakawa et al. | 392/419 X |
| 4,792,658 | 12/1988 | Langhans et al. | 219/85.12 X |
| 4,855,559 | 8/1989 | Donner | 228/180.21 X |
| 5,196,667 | 3/1993 | Gammelin | 219/85.12 |

FOREIGN PATENT DOCUMENTS 2-30371 1/1990 Japan ................. 392/419

*Primary Examiner*—Carl J. Arbes
*Attorney, Agent, or Firm*—Spencer & Frank

[57] ABSTRACT

A device or oven and a method for soldering components (34, 36) onto boards (18), with the device having at least a preheating zone (10) and a soldering zone (12), and a transport device (16), by means of which the boards (18) can be moved from one zone (10) to the next. Infrared radiators (22) extending in the transport direction (20) are disposed in the preheating zone (10) and infrared radiators (24) extending transversely to the transport direction (20) are disposed in the soldering zone (12), with the radiators radiating essentially diagonally, i.e., obliquely, the board surface. As a result, it is achieved that less radiation is absorbed on the surface of the board, or the top surfaces of the components (34, 36), than on the side walls of the corresponding components (34, 38). Moreover, according to a further feature of the invention soldering ovens are adjusted using sensors (54, 56) disposed on measuring boards (18') and in the oven (10, 12).

21 Claims, 4 Drawing Sheets

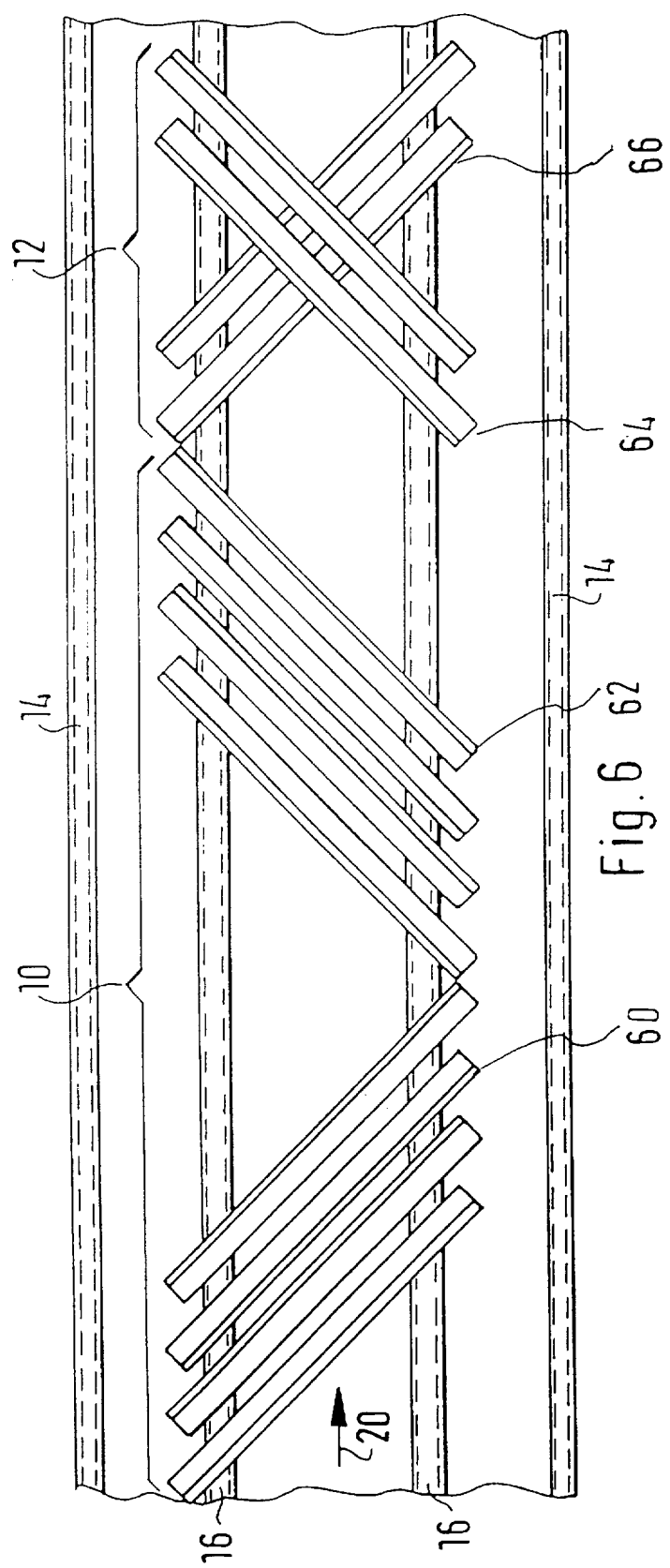

APPARATUS AND PROCESS FOR SOLDERING COMPONENT ONTO BOARDS

STATE OF THE ART

The invention relates to a device and a method for soldering components onto boards wherein the device has at least a preheating zone and a soldering zone and a transport device by means of which the boards can be moved from one zone to the next. In known soldering devices, so-called reflow soldering ovens, the boards are imprinted with soldering paste at the locations provided for the components prior to the soldering process; afterward, the components are placed with their connections on these locations, and the soldering paste is melted in a subsequent heating process, which produces a permanent connection between the components and the board. The heat application process is configured such that the board is heated entirely in linear fashion up to just below the melting temperature of the solder, then briefly heated above the melting temperature and cooled again as rapidly as possible.

Due to different mass/surface ratios of free board regions and locations having bulky components or high component densities, a temperature difference can develop inside a board during heating that may lead to edge regions of the board already being destroyed by overheating, while the regions having bulky components or high component density have not yet reached the melting temperature of the solder. It is already known to heat the board slowly and thus create a temperature balance between hot and cold locations over the board by means of heat conduction over a lengthy period of time. This is, however, unsatisfactory with respect to optimum utilization of the system's capacity. Furthermore, it is known from DE-OS 38 06 753 to scan the board with a sensor or an image-recognition device and purposefully supply heat to individual regions. This system is costly, however, and correspondingly susceptible to interference, and is therefore not suitable for board series that are produced in large quantities.

SUMMARY AND ADVANTAGES OF THE INVENTION

According to the first embodiment of the present invention, there is provided a device for soldering components onto boards, with the device having at least a preheating zone and a soldering zone, a transport device by means of which the boards can be moved from one zone to the next, infrared radiators having longitudinal axes extending in the transport direction which are disposed in the preheating zone, and infrared radiators having longitudinal axes extending transversely to the transport direction which are disposed in the soldering zone, and wherein the radiators radiate essentially diagonally, i.e., inclinedly or obliquely, onto the board surface with their main beam axes.

According to a further basic embodiment of the present invention there is provided a device for soldering components onto boards with the device having at least a preheating zone and a soldering zone, a transport device by means of which the boards can be moved from one zone to the next, infrared radiators having longitudinal axes extending at an angle of preferably 45 degrees from the transport direction disposed in the preheating zone and in the soldering zone such that the longitudinal axes of at least some of the infrared radiators cross and wherein the radiators radiate essentially diagonally, i.e., obliquely, or inclined, onto the board surface with their main beam axes.

In contrast, the advantage of the devices and method of the invention having the features of the independent claims is that less radiation is absorbed at the board surface than on the side walls of the bulky components or in the regions having high component density. In this way it is accomplished that heat is supplied exactly to where it is needed.

The cross-type arrangement of the infrared radiators extending lengthwise or transversely permits, in a simple manner, each point or each vertical wall on the board surface to be heated evenly.

Advantages embodiments of the invention according to the main claim are possible due to the measures outlined in the dependent claims. In particular, a diagonal, i.e., inclined, position in which the axis of the beam direction of the infrared radiator forms an angle between 45 and 75 degrees, preferably an angle of 65 degrees, with the normal of the board, surface has the effect that the walls standing vertically on the board are supplied with the greatest possible radiation power. The attachment of a rear-side reflector to the infrared radiator reduces radiation losses, and further permits variation of the beam cone with corresponding shaping of the reflector; in particular, a homogenous intensity distribution over the board surface can be achieved.

The use of very hot quartz radiators effects an advantageous radiation energy transport that is independent of the board temperature. Moreover, such quartz radiators can be controlled quickly and simply, so the device can be heated rapidly and briefly adjusted.

A uniform temperature distribution over the board surface can advantageously be achieved in that a gas, preferably an inert gas, is conducted over the board surface by means of a fan. The board itself can be protected against overheating in that it is cooled, for example, from below by a gas of predetermined temperature. The large, colder components on the top side remain unaffected by this carrying off of heat, which particularly advantageously minimizes the temperature difference between the board and the large components. In some cases it can be favorable to blow preheated gas onto the underside of the board, in which instance the basic concept of the carrying off of heat is also applicable.

To prevent uncontrolled contributions to heat transport, it is advantageous to maintain the walls of the device or transport device at a constant, predetermined temperature.

Particularly in the setting of the device, it is advantageous when at least one sensor that detects the temperature of the board is provided on the board. This sensor can be constructed with a real-time control in connection with the quartz radiators, which can be controlled quickly, and the new operating parameters, such as transport speed, power of the infrared radiator, blowing in of a hot or cold gas, etc., can be determined with only one pass of the board. The control parameters of the soldering zone can be analytically inferred from the measured values of the preheating zone.

With the claimed methods it becomes possible to adapt the device simply and quickly to a particular board type, that is, to determine the process parameters, such as radiation power and transport speed. It is advantageous when the device has a homogenous radiation field and the heat is supplied in an intensified state to the wall regions of the components to be soldered; it is, however, not absolutely necessary.

If at least two temperature sensors are disposed on the measuring board, if possible at the locations of highest and lowest temperature, the temperature difference within a board can be determined in this manner, by means of which additional measures, such as blowing gas of a predetermined temperature against the underside of the board, can be inferred.

If the radiation power is recorded by a sensor disposed in the device, the actual radiation power can be determined free from influences, such as effectiveness or arrangement of the infrared radiators.

BRIEF DESCRIPTION OF THE DRAWINGS

Two embodiments are illustrated in the drawing and described in the following description, with the disclosure of further advantages. FIG. 6 shows a view of the second embodiment from above, without the board to be soldered.

DESCRIPTION OF THE PREFERRED EMBODIMENT

Figure 1:
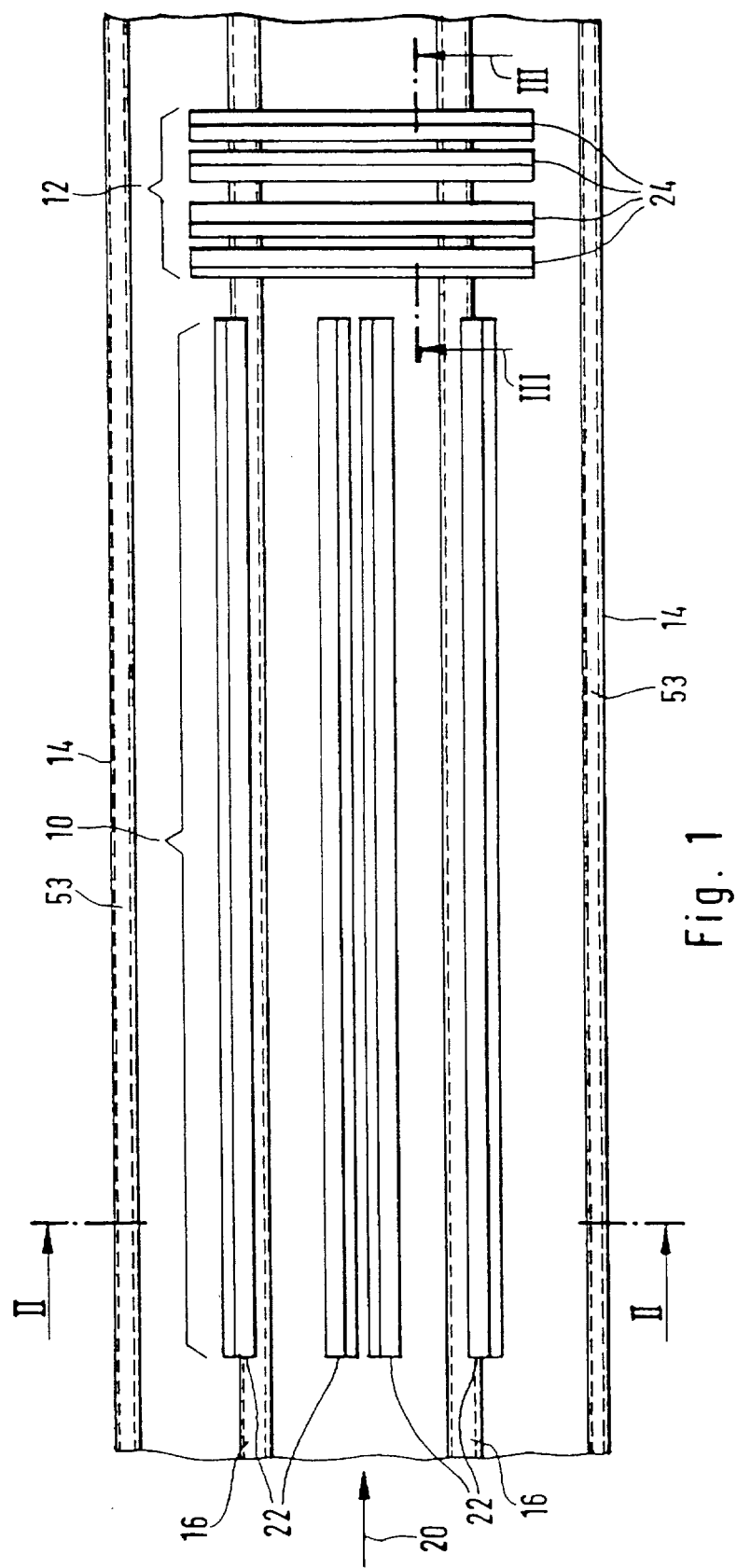
FIG. 1 shows a view of the first embodiment from above, without a board to be soldered.

In FIG. 1 the principle of a reflow oven according to the first embodiment is shown from above, the embodiment including a preheating zone 10 and a soldering zone 12 within defined walls 14. A transport device comprising two transport belts 16 extends between the walls 14, through the preheating zone 10 and the soldering zone 12, and transports circuit boards 18 placed on top of them in the direction of arrow 20. Infrared radiators 22 extending parallel to the transport belts 16 are disposed above the transport belts in the preheating zone 10. Infrared radiators 24 extending transversely to the transport belts 16 are disposed above the transport belts 16 in the soldering zone 12.

According to the second embodiment (FIG. 6), infrared radiators 60, 62 or 64, 66 are disposed above the transport belts 16, in the preheating zone 10 or in the soldering zone 12, respectively; these sensors form an angle of preferably 45 degrees with the transport direction 20. The infrared radiators 60 and 62 or 64 and 66 are disposed such that they form an angle of nearly 90 degrees; as shown in the preheating zone 10, the infrared radiators 60, 62 can lie one behind the other or, as shown in the soldering zone 12, the infrared radiators 64, 66 can lie one above the other. It is also conceivable for all infrared radiators 60, 62 or 64, 66 to be disposed in one zone 10 or 12, parallel to one another and at an angle with the infrared radiators of the other zone.

The infrared radiators 22, 60, 62 of the preheating zone 10 are adjusted such that their main beam axis 26 (FIG. 2) points diagonally or obliquely onto the surfaces of the circuit boards 18 guided through below. The main beam axis 26 forms an angle 32 between 45 and 75 degrees, preferably 65 degrees, with the board normal 28, which extends at a right angle to the surface of the board 30. The effect of this diagonal or inclined position is that the radiation intensity on the upper surface of the components to be soldered onto the circuit board 18, particularly integrated circuits 34 or SMD components 36, is lower than on the side surfaces of these components. The points of contact between the leads 38 of the ICs 34 and the contact points on the board 30, or the contact surfaces 40 of the SMD components 36 and the contact point on the board 30, are thus preferably heated. The result is a smaller temperature difference between large components and free board regions, which reduces the thermal stress on the board regions and the electronic components, and thus increases the radiation power, and the heating time in the preheating zone 10 can be shortened.

The infrared radiators 22, 60, 62 are staggered and disposed such that components seated adjacent to one another can also be heated to a sufficient degree without the occurrence of a shadow effect.

Figure 3:
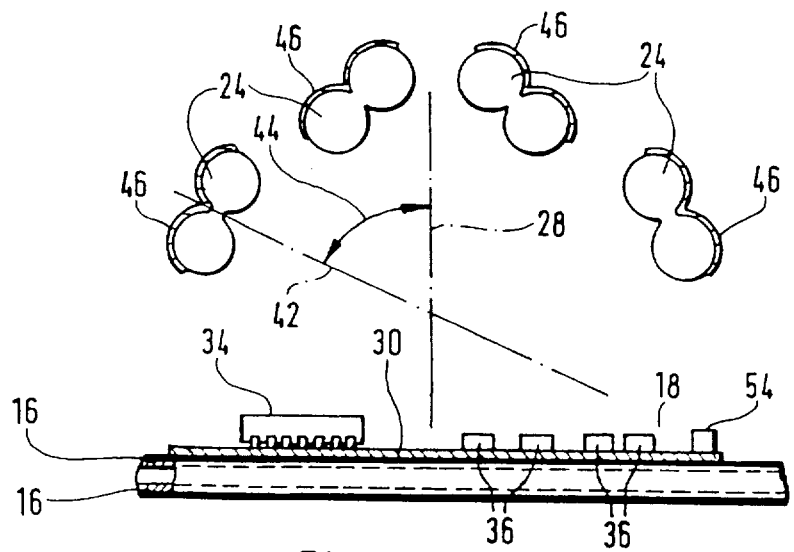
FIG. 3 shows a section along line III/III in FIG. 1, each with an inserted board. A typical temperature profile of a soldering process is shown in FIG. 4, and a radiation power distribution of a device according to the invention is shown in FIG. 5.

In the soldering zone 12 (FIG. 3), in which rapid heating of the contact points 38, 30 and 40, 30 to above the melting point of the solder is effected, the infrared radiators 24, 64, 60 are disposed transversely or at an angle to the transport direction 20, and point with their main beam axis 42 at a diagonal onto the circuit board 18, with the main beam axis 42 likewise forming an angle 44 between 45 and 75 degrees, preferably an angle of 65 degrees. Because of this, regions in the preheating zone 10 that would more likely be irradiated tangentially are reached directly, effecting an intensive heating. In this instance as well, the infrared radiators 24 are staggered in order to prevent a shadow effect.

Due to the special arrangement of the infrared radiators 22, 60, 62 and 24, 64, 66 in the preheating zone 10 and soldering zone 12, it is possible to use very hot quartz radiators, i.e., that radiate with a temperature above 2000 degrees Celsius, and that effect a radiation energy transport which, in a first approximation, is independent of the instantaneous board temperature. On their rear sides, the infrared radiators 22, 24, 60, 62, 64, 66 have gold reflectors 46 in order to increase the radiation power in the direction of the boards. The shape of the reflectors 46 is selected such that optimum, homogeneous illumination of the board surface is achieved.

Figure 2:
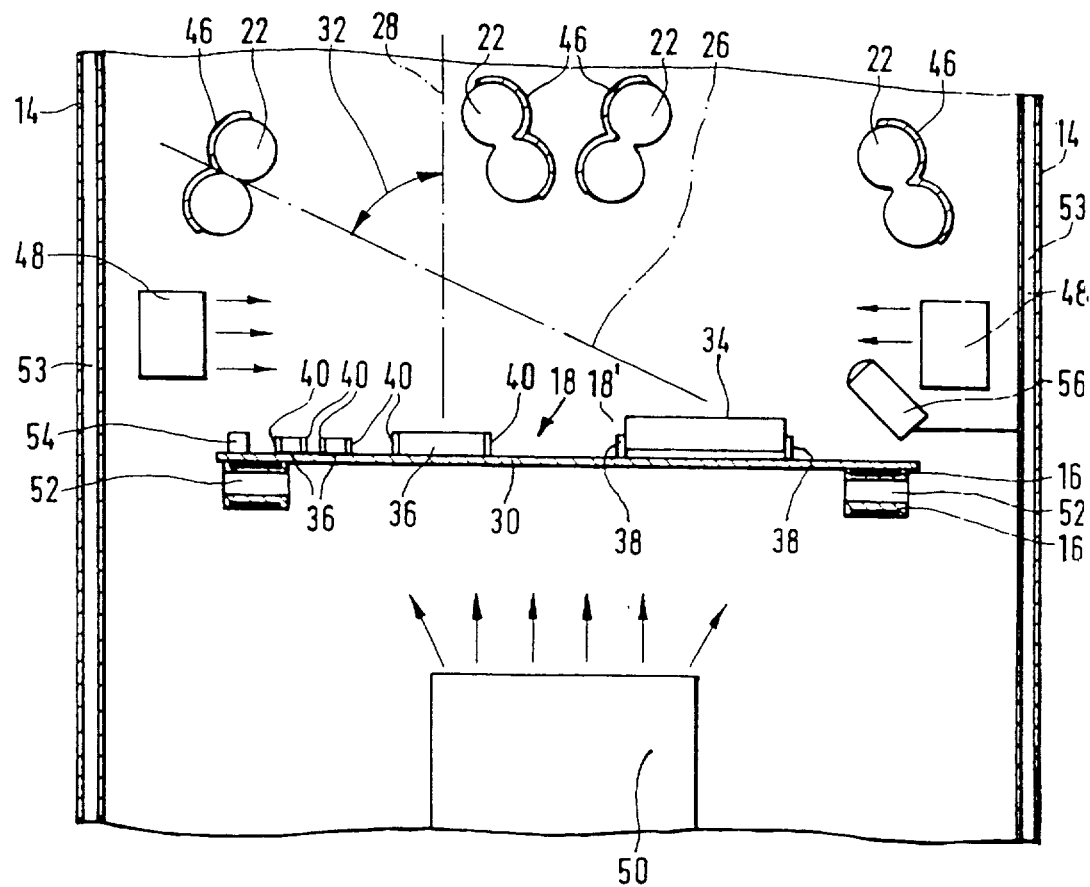
FIG. 2 shows a section along line II/II in FIG. 1.

In a particular embodiment, the reflow oven has a supply air system 48, for example in the form of ventilators or one or a plurality of fans, by means of which hot gas is conducted over the regions to be soldered. The supply air system 48 need not necessarily be disposed to the side of the transport belts 16, as shown in FIG. 2. The only crucial point is that the most homogenous possible temperature distribution over the board surface is achieved through the convection created.

A further supply air system 50 for supplying a cooling gas flow is disposed, for example, beneath the transport belts 16; in this way, the system cools the underside of the circuit boards 18.

Inert gas or gas having flux properties can also be used as the heating or cooling gas, which is then supplied under pressure from external containers. To manage with the smallest quantity of gas to be blown in, the supply takes place with the use of the Venturi principle. In this case, the unburned gas flowing in through a Venturi nozzle draws in the gas already located in the interior, and thus effects a circulation within a zone.

The transport belts 16, on whose respectively upper run the circuit boards 18 lie, are each guided on a hollow profile 52, through whose hollow cross-section a tempered fluid flows, thus maintaining the transport belts 16 at a predetermined temperature. Moreover, the walls 14 are provided with hollow chambers 53, which are flowed through by fluid, so that the walls can also be maintained at a predetermined temperature. These measures prove to be advantageous particularly when the device must be operated under extreme or changing conditions.

At least one sensor 54 that records the temperature is disposed on a board 18, hereinafter referred to as measuring board 18', in particular to establish the temperature profile, i.e., the heating per unit time of the circuit boards 18, as well as to monitor and control the power of the infrared sensors 22, 24, 60, 62, 64, 66, the speed of the transport belts 16 or other parameters. The sensor 54 is preferably disposed at problem zones, for example at the edge of the circuit board 18 or in the vicinity of components of large dimension. A plurality of sensors 54 can also be provided so as to be distributed over the measuring board 18'. Moreover, a further sensor 56, preferably an infrared detector, is provided for recording the radiation power, particularly in the preheating zone 10.

Figure 4:
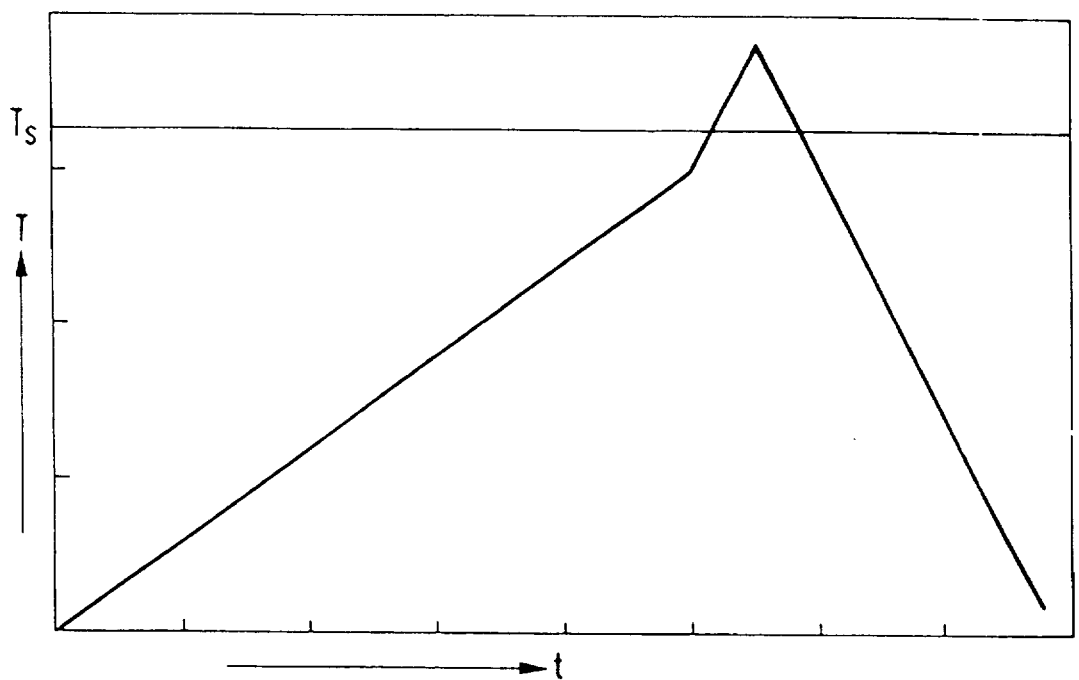
Figure 5:
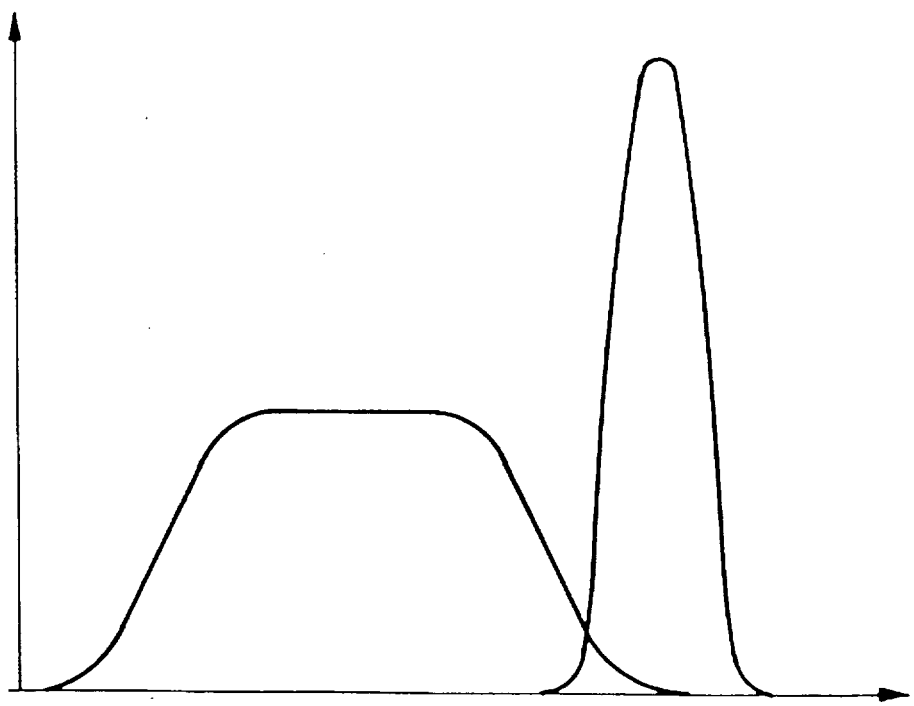

In a typical soldering process, a circuit board 18 equipped with components 34, 36 lying on the transport belts 16 passes through the preheating zone 12 at a predetermined speed, and experiences the radiation power density dominating therein (FIG. 5). The temperature of the board, particularly of the contact points 38, 30 or 40, 30, increases virtually in linear fashion until it is just under the melting temperature $T_s$ of the solder used (FIG. 4). In the soldering zone 12, a rapid heating to above the melting temperature $T_s$ is achieved due to the radiation power density dominating therein, and a rapid cooling after the soldering zone is achieved by the blowing of the underside of the board.

In order to adjust a device for soldering components onto boards, particularly of an above-described soldering oven, that is, to find and set the parameters for an optimum soldering process, the measuring board 18' is positioned beneath the radiation field of the preheating zone 10. A temperature set value which increases over time is predetermined by a control apparatus, for example a computer. The temperature of the boards 18 to be soldered should follow this temperature set value during the later soldering process. For this purpose the radiation power of the infrared radiators 22 or 60, 62 is set at an initial value, and the temperature is recorded by the sensor 54 on the measuring board 18' and compared to the temperature set value. If deviations of the recorded temperature from the temperature set value occur, the radiation power of the infrared radiators 22 or 60, 62 is increased when the temperature is measured to be too low, and reduced when the temperature is too high. The radiation power emitted during the expiring time is recorded, and an average temporal value is derived from this.

The radiation power can be determined, for example, via the electrical energy or by a further sensor 56, particularly an infrared detector, disposed in the soldering oven.

The base setting of the soldering device can then be determined from the geometric data—the total length of the soldering device divided by the maximum sojourn time of each board 18 in the soldering oven results in the transport speed—and from the derived average value, as the setting magnitude for the radiation power of the infrared radiators 22, 24 or 60, 62, 64, 66. If the sojourn time is shortened, the average value, or the radiation power, must be correspondingly increased.

The temperature curve to be predetermined by the control apparatus, and which increases over time, also results from the temperature increase to be attained as a function of the sojourn time of the boards 18 in the preheating zone 10. This need not necessarily be linear, but can also have other temporal courses due to radiation losses or gas turbulence.

The above-named adjustment method is particularly suited for homogenous radiation power densities inside a zone 10, 12. The adjustment method described below can be used in soldering ovens that have no homogenous power density distribution.

A measuring board 18' is moved through at least the preheating zone 10, or also the soldering zone 12, by means of the transport belts 16. With predetermined beam power of the infrared radiators 22 or 24, the temperature on the measuring board 18' increases. The temperature recorded by the sensor 54 is compared to a temperature set value that is predetermined by a control apparatus and increases over time. If deviations occur, the beam power is correspondingly readjusted. The sensor 50 records the beam power and conducts it further to the control apparatus or a separate computer, in which an average value is formed.

The adjustment parameters for the transport speed result from the length of the oven divided by the maximum sojourn of a board 18 in the oven, and the beam power of the infrared radiators 22, 60, 62 or 24, 64, 66 from the determined average value, or values when a plurality of measuring boards 18' is used. The temperature set value that increases over time results from the necessary temperature increase of each board 18 within the sojourn time of a board 18 in a zone 10, 12. Also in this case, the temperature set value need not necessarily increase in linear fashion.

If a plurality of sensors 54 recording the temperature on each measuring board 18' is disposed such that at least the highest and lowest temperatures occurring during a soldering process can be detected, it can be recognized from the detected temperature difference whether the danger of overheating exists for individual board regions. At least these regions are then blown upon from below with a cooling gas.

With the sensor 56 located in the oven, a control for the radiation power during each soldering process can be designed by means of the control apparatus of a computer. It is also conceivable to perform the described method to adjust a soldering oven during the continuous soldering process. To this end, each board 18 to be soldered would have to have a sensor 54, which is attached, for example, before the entrance of the boards into the soldering oven and removed again afterward. In this way, the beam power required for the soldering zone 12 can be inferred from the data of the preheating zone 12. However, a control within a zone 10, 12 can also be effected by the use of rapidly-controllable quartz radiators.

I claim:

1. Method of soldering components onto boards with a device having at least a preheating zone and a soldering zone, and a transport device by means of which the boards can be moved from one zone to the next, and wherein infrared radiators are disposed in the preheating zone and in the soldering zone such that they radiate diagonally onto the board surface with their main beam axes, and comprising the steps of: (a) positioning a measuring board, which has at least one sensor that records the temperature, beneath the radiation field of a zone, (b) predetermining a temperature set value that increases over time by use of a control apparatus, (c) setting the radiation power at an initial value and comparing the temperature recorded by the sensor on the measuring board with the temperature set value, and if deviations are present, making an adjustment, (d) detecting the radiation power and forming an average value from the detected radiation power, and (e) determining the parameters for continuous passage, such as radiation power and transport speed, with the aid of this average value.

2. A method according to claim 1, wherein the measuring board has at least two sensors that detect the temperature, and further comprising disposing one of said sensors in the region of the highest temperature and disposing another sensor in the region of the lowest temperature.

3. A method according to claim 1, further comprising recording the radiation power by a sensor disposed in the soldering device.

4. Method of soldering components onto boards with a device having at least a preheating zone and a soldering zone, a transport device by means of which the boards can be moved from one zone to the next, and infrared radiators disposed in the preheating zone and in the soldering zone such that they radiate diagonally onto the board surface with their main beam axes, and comprising the steps of (a) moving a measuring board having at least one sensor that detects the temperature through at least the preheating zone, (b) predetermining a temperature set value that increases over time by use of a control apparatus, (c) setting the radiation power at an initial value, detecting the temperature on the measuring board during the movement of the measuring board through at least the preheating zone, comparing the detected temperature to the temperature set value, and if deviations are present, correspondingly adjusting the radiation power by use of the controlling apparatus, (d) detecting the radiation power and forming an average value from the detected radiation power, and (e) determining parameters for continuous passage, such as radiation power and transport speed, with the aid of this average value.

5. A method according to claim 4, wherein the measuring board has at least two sensors that detect the temperature, and further comprising disposing one of said sensors in the region of the highest temperature and disposing another sensor in the region of the lowest temperature.

6. A method according to claim 4, further comprising recording the radiation power by a sensor disposed in the soldering device.

7. Device for soldering components onto boards, with said device having at least a preheating zone and a soldering zone, and further comprising a transport device by means of which the boards can be moved from one zone to the next, infrared radiators extending in the transport direction disposed in the preheating zone, and infrared radiators extending transversely to the transport direction disposed in the soldering zone, and wherein the radiators radiate essentially diagonally onto the board surface with their main beam axes.

8. Device according to claim 7 wherein the device for soldering components onto boards is an oven.

9. Device according to claim 7, wherein the axis of the beam direction of the infrared radiators forms an angle between 45 degrees and 75 degrees, preferably an angle of 65 degrees, with the board surface normal.

10. Device according to claim 7, wherein the infrared radiators have a reflector on their rear side.

11. Device according to claim 7, wherein rapidly controllable quartz radiators are used as the infrared radiators.

12. Device according to claim 7, wherein means are provided for supplying gas of a predetermined temperature.

13. Device according to claim 7, wherein means are provided for maintaining at least one of the transport device and walls of the soldering device at a predetermined temperature.

14. Device according to claim 7, wherein at least one sensor that detects the temperature of the board and a sensor that detects the radiation power are provided.

15. Device for soldering components onto boards, with said device having at least a preheating zone and a soldering zone, and further comprising a transport device by means of which the boards can be moved from one zone to the next, and infrared radiators having longitudinal axes extending at an angle of preferably 45 degrees from the transport direction, said infrared radiators being disposed in the preheating zone and in the soldering zone such that the longitudinal axes of at least some of the infrared radiators cross, and said infrared radiators radiating essentially diagonally onto the board surface with their main beam axis.

16. Device according to claim 15, wherein the axis of the beam direction of the infrared radiators forms an angle between 45 degrees and 75 degrees, preferably an angle of 65 degrees, with the board surface normal.

17. Device according to claim 15, wherein the infrared radiators have a reflector on their rear side.

18. Device according to claim 15, wherein rapidly controllable quartz radiators are used as the infrared radiators.

19. Device according to claim 15, wherein means are provided for supplying gas of a predetermined temperature.

20. Device according to claim 15, wherein means are provided for maintaining at least one of the transport device and walls of the soldering device at a predetermined temperature.

21. Device according to claim 15, wherein at least one sensor that detects the temperature of the board and a sensor that detects the radiation power are provided.

* * * * *